(12) United States Patent
Kim et al.

(10) Patent No.: US 10,951,203 B1
(45) Date of Patent: Mar. 16, 2021

(54) SEMICONDUCTOR DEVICE AND METHOD FOR CONTROLLING AMPLITUDE OF SIGNAL IN THE SEMICONDUCTOR DEVICE

(71) Applicant: Samsung Electronics Co., Ltd., Suwon-si (KR)

(72) Inventors: Seung Jin Kim, Hwaseong-si (KR); Wan Kim, Hwaseong-si (KR); Seung Hyun Oh, Seoul (KR); Byung Ki Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/842,051

(22) Filed: Apr. 7, 2020

(30) Foreign Application Priority Data

Aug. 20, 2019 (KR) .................. 10-2019-0101764

(51) Int. Cl.
*H03K 5/22* (2006.01)
*H03K 5/24* (2006.01)
*H03B 5/12* (2006.01)
*H03B 5/04* (2006.01)

(52) U.S. Cl.
CPC ............. *H03K 5/24* (2013.01); *H03B 5/04* (2013.01); *H03B 5/1278* (2013.01)

(58) Field of Classification Search
CPC ........... H03K 5/24; H03B 5/1278; H03B 5/04
USPC .................................................. 327/63, 129
See application file for complete search history.

(56) References Cited

U.S. PATENT DOCUMENTS

| 6,747,522 | B2 | 6/2004 | Pietruszynski et al. | |
| 7,035,607 | B2 * | 4/2006 | Lim | H03B 5/366 331/36 R |
| 7,183,864 | B1 | 2/2007 | Gutnik | |
| 7,868,710 | B1 * | 1/2011 | Farahvash | H03B 5/366 331/179 |
| 7,961,060 | B1 * | 6/2011 | McMenamy | H03L 5/00 331/186 |
| 8,063,711 | B2 | 11/2011 | Sutardja | |

(Continued)

FOREIGN PATENT DOCUMENTS

JP 2011-082744 A 4/2011

OTHER PUBLICATIONS

Danielle Griffith et al., "A 37 µW Dual-Mode Crystal Oscillator for Single-Crystal Radios", IEEE International Solid-State Circuits Conference, Session 5, Analog Techniques, pp. 104-105, 2015.

(Continued)

*Primary Examiner* — Ryan Jager
(74) *Attorney, Agent, or Firm* — Harness, Dickey & Pierce, P.L.C.

(57) ABSTRACT

A semiconductor device and a method for controlling amplitude of signal in the semiconductor device are provided. The semiconductor device comprises a signal generator configured to output a sinewave, a comparator configured to compare a magnitude of the sinewave with a magnitude of a reference signal at a first timing corresponding to a timing control signal and to output a comparison result, and a control signal adjustor configured to adjust one of the current control signal and a timing control signal depending on the comparison result of the comparator.

20 Claims, 11 Drawing Sheets

(56) References Cited

U.S. PATENT DOCUMENTS

| | | | |
|---|---|---|---|
| 8,816,786 B2 * | 8/2014 | Tham | H03B 5/364 |
| | | | 331/109 |
| 8,873,682 B2 | 10/2014 | Mehio et al. | |
| 8,922,287 B2 * | 12/2014 | Vilas Boas | H03B 5/06 |
| | | | 331/158 |
| 9,234,936 B1 | 1/2016 | Thakur et al. | |
| 9,252,784 B2 | 2/2016 | Lee et al. | |
| 9,258,109 B2 | 2/2016 | Francese et al. | |
| 9,647,670 B2 * | 5/2017 | Viegas | H03B 5/32 |
| 9,823,687 B2 | 11/2017 | Mukherji et al. | |
| 10,574,185 B2 * | 2/2020 | Marques | H03B 5/366 |
| 2012/0326794 A1 * | 12/2012 | Kammula | H03B 5/362 |
| | | | 331/15 |

OTHER PUBLICATIONS

Ming Ding et al., "A 95 µW 24MHz Digitally Controlled Crystal Oscillator for IoT Applications with 36nJ Start-Up Energy and >13x Start-Up Time Reduction Using a Fully-Autonomous Dynamically-Adjusted Load", IEEE International Solid-State Circuits Conference, Session 5, Analog Techniques, pp. 90-91, 2017.

Jerry Lin, "A Low-Phase-Noise 0.004ppm/Step DCXO with Guarateed Monotonicity in 90nm CMOS", IEEE International Solid-State Circuits Conference, Session 22, pp. 418-419, 2005.

\* cited by examiner

FIG. 9

| Timing | TCS | ICS |
|--------|-----|-----|
| Init | 000 | 111 |
| T1 | 000→001 | 111 |
| T2 | 001→010 | 111 |
| T3 | 010 | 111→110 |
| T4 | 010→011 | 110 |
| T5 | 011 | 110→101 |
| T6 | 011→100 | 101 |
| T7 | 100→101 | 101 |
| T8 | 101 | 101 |

SEMICONDUCTOR DEVICE AND METHOD FOR CONTROLLING AMPLITUDE OF SIGNAL IN THE SEMICONDUCTOR DEVICE

BACKGROUND

1. Technical Field

The present inventive concepts relate to a semiconductor device and a method for controlling the amplitude of a signal in the semiconductor device.

2. Description of the Related Art

Since a temperature compensated crystal oscillator (TCXO) is an expensive external element, many alternative oscillators using inexpensive crystal external elements have been studied.

An output frequency of the oscillator is implemented, for example, through an adjustment of capacitance, and may be divided into a digitally controlled crystal oscillator (DCXO), a voltage controlled crystal oscillator (VCXO) and the like, depending on the adjustment method of the capacitance.

The oscillators using the external crystal need to be adjusted to optimized amplitude values that may minimize a phase noise, and researches thereof continue.

SUMMARY

Aspects of the present inventive concepts provide a semiconductor device capable of adjusting the optimum amplitude of a crystal oscillator at a low cost.

Aspects of the inventive concepts also provide a method for adjusting amplitude of signal in a semiconductor device capable of adjusting the optimum amplitude of a crystal oscillator at a low cost.

However, aspects of the inventive concepts are not restricted to the one set forth herein. The above and other aspects of the present inventive concepts will become more apparent to one of ordinary skill in the art to which the inventive concepts pertains by referencing the detailed description of the inventive concepts given below.

According to an aspect of the present inventive concepts, there is provided a semiconductor device comprises a signal generator configured to output a sinewave, amplitude of the sinewave being adjusted depending on a current control signal supplied to the signal generator, a comparator configured to compare a magnitude of the sinewave provided from the signal generator with a magnitude of a reference signal and to output a comparison result at a first timing corresponding to a timing control signal, and a control signal adjustor configured to adjust one of the current control signal and the timing control signal depending on the comparison result of the comparator.

According to another aspect of the present inventive concepts, there is provided a semiconductor device comprises a signal generator configured to output a sinewave, and an amplitude adjusting device configured to compare a magnitude of the sinewave with a magnitude of a reference signal at first timing before the sinewave reaches a phase of $\pi/2$, and to execute one of a first operation or a second operation on the basis of a comparison result thereof, the first operation including adjusting the magnitude of the sinewave, and the second operation including adjusting a timing of comparing the magnitude of the sinewave with the magnitude of the reference signal to a second timing different from the first timing to compare the magnitude of the sinewave with the magnitude of the reference signal.

According to another aspect of the present inventive concepts, there is provided a semiconductor device comprises a reference clock generator configured to generate a reference clock, the reference clock generator comprising a signal generator configured to output a sinewave, using a crystal oscillator, a frequency adjusting device configured to adjust the frequency of the sinewave depending on a temperature change, an amplitude adjusting device configured to compare a magnitude of the sinewave with a magnitude of a reference signal at a predetermined comparison timing before a phase of the sinewave reaches $\pi/2$ to adjust the magnitude of the sinewave, and a clock generator configured to convert the sinewave into a square wave to generate the reference clock; and a functional module configured to receive the reference clock from the reference clock generator and to execute a predetermined operation, using the reference clock.

According to another aspect of the present inventive concepts, there is provided a method for adjusting amplitude of a signal in a semiconductor device, the method comprises receiving a sinewave, and comparing a magnitude of the sinewave with a magnitude of a reference signal at a first timing before the sinewave reaches a phase of $\pi/2$; and executing one of a first operation or a second operation on the basis of a comparison result thereof, the first operation including adjusting the magnitude of the sinewave, and the second operation including adjusting a timing of comparing the magnitude of the sinewave with the magnitude of the reference signal to a second timing different from the first timing to compare the magnitude of the sinewave with the magnitude of the reference signal.

BRIEF DESCRIPTION OF THE DRAWINGS

The above and other aspects and features of the present inventive concepts will become more apparent by describing in detail example embodiments thereof with reference to the attached drawings, in which:

FIGS. 9 and 10 are diagrams for explaining the method for adjusting the amplitude of signals in the semiconductor device according to some embodiments;

DETAILED DESCRIPTION OF THE EMBODIMENTS

Embodiments according to the technical idea of the present inventive concepts will be described below with reference to the accompanying drawings.

Figure 1:
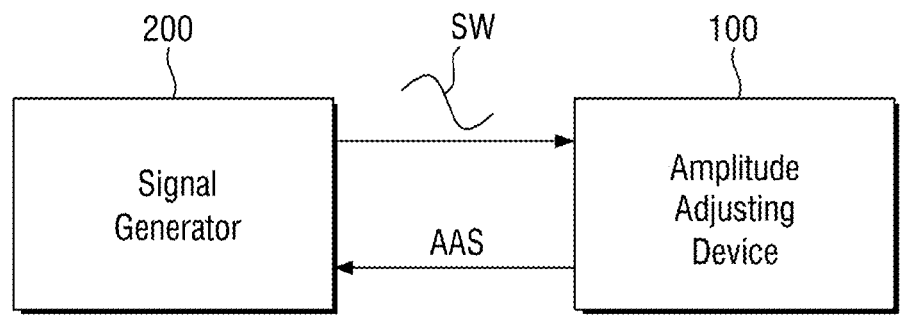
FIG. 1 is a block diagram of a semiconductor device according to some embodiments.

FIG. 1 is a block diagram of a semiconductor device according to some embodiments.

Referring to FIG. 1, the semiconductor device may include an amplitude adjusting device 100 and a signal generator 200.

The signal generator 200 may generate a signal. For example, the signal generator 200 may generate a sinewave SW. The sinewave SW generated from the signal generator 200 may be provided to the amplitude adjusting device 100.

The amplitude adjusting device 100 may receive the sinewave SW from the signal generator 200, and may provide an amplitude adjustment signal (AAS) to the signal generator 200 to adjust the amplitude of the sinewave SW output from the signal generator 200. In some embodiments, the amplitude adjusting device 100 may adjust the amplitude of the sinewave SW output from the signal generator 200 so that the amplitude of the sinewave SW output from the signal generator 200 becomes an optimized amplitude that may minimize or prevent phase noise. For example, the amplitude adjusting device 100 may adjust the amplitude of the sinewave SW by adjusting the swing size between similar or equivalent peaks (e.g., maximum to maximum peaks or minimum to minimum peaks of the sinewave SW).

In some embodiments, the amplitude adjusting device 100 compares the magnitude of the sinewave SW with the magnitude of the reference signal at a first timing before the sinewave phase (SW) reaches $\pi/2$, and may execute one of a first operation or a second operation on the basis of the results of the comparison thereof. For example, the amplitude adjusting device 100 may compare the magnitude of the sinewave SW (e.g., an absolute size of the sinewave SW) to the magnitude of the reference signal (e.g., an absolute size of the reference signal) at the first timing.

In some embodiments, the first operation includes, for example, adjustment of the magnitude of the sinewave SW through an amplitude adjustment signal (AAS), and the second operation may include adjustment of the timing of comparing the magnitude of the sinewave SW with the magnitude of the reference signal to a second timing different from the first timing to compare the magnitude of the sinewave with the magnitude of the reference signal. More specific operations thereof will be described later.

In some embodiments, although the semiconductor device may be, for example, an automatic amplitude calibration (AAC) that adjusts the amplitude of the signal which is output from the signal generator 200 through adjustment of the sampling timing, the embodiments are not limited thereto.

The amplitude adjusting device 100 and the signal generator 200 may be implemented in various forms. For example, the amplitude adjusting device 100 and the signal generator 200, according to one or more example embodiments, may be implemented using hardware and/or a combination of hardware and software. For instance, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. The software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Hereinafter, although the configuration of the semiconductor device according to some embodiments will be described more specifically with reference to FIGS. 2 to 6, the embodiments the present inventive concepts are not limited to the configurations which will be described below.

Figure 2:
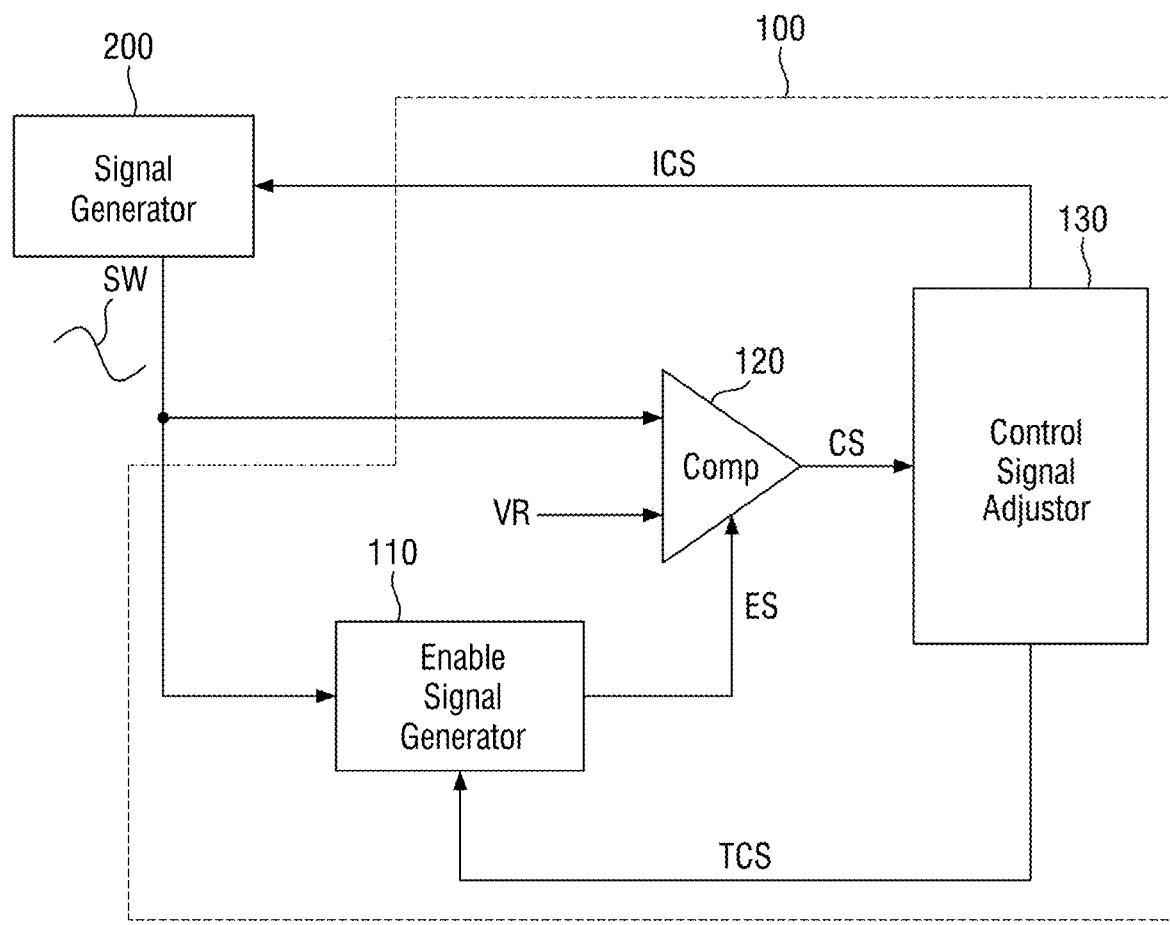
FIG. 2 is an example block diagram of an amplitude adjusting device of FIG. 1.
Figure 3:
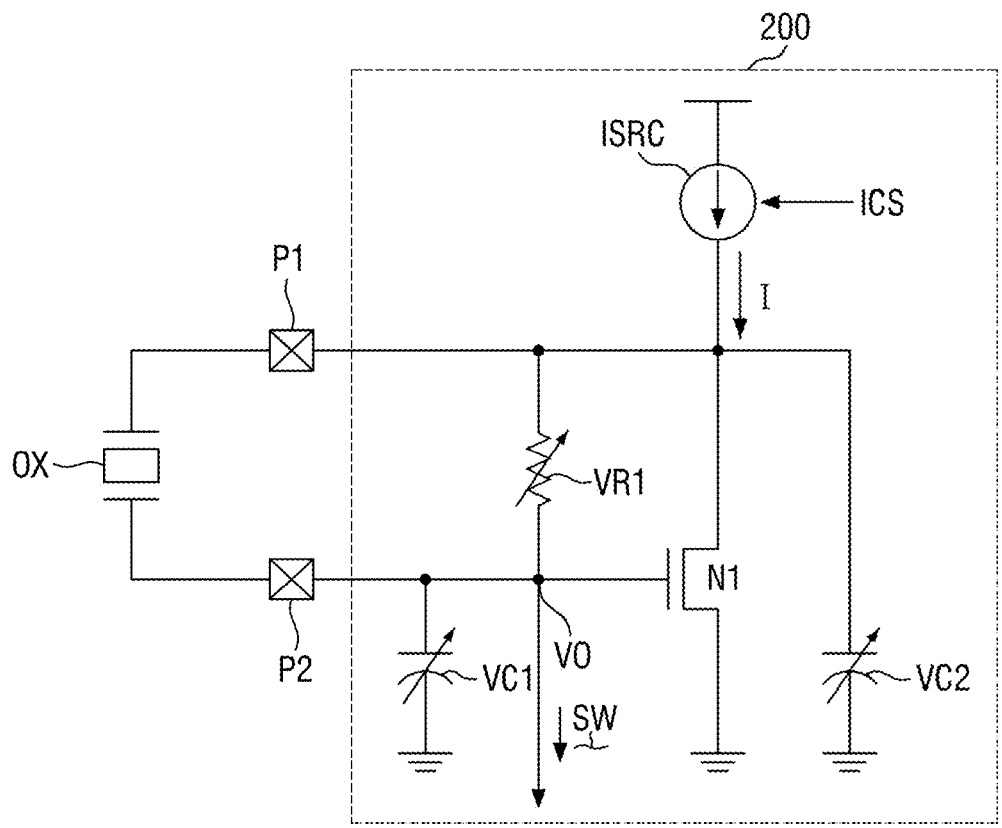
FIG. 3 is an example block diagram of a signal generator of FIG. 2.
Figure 4:
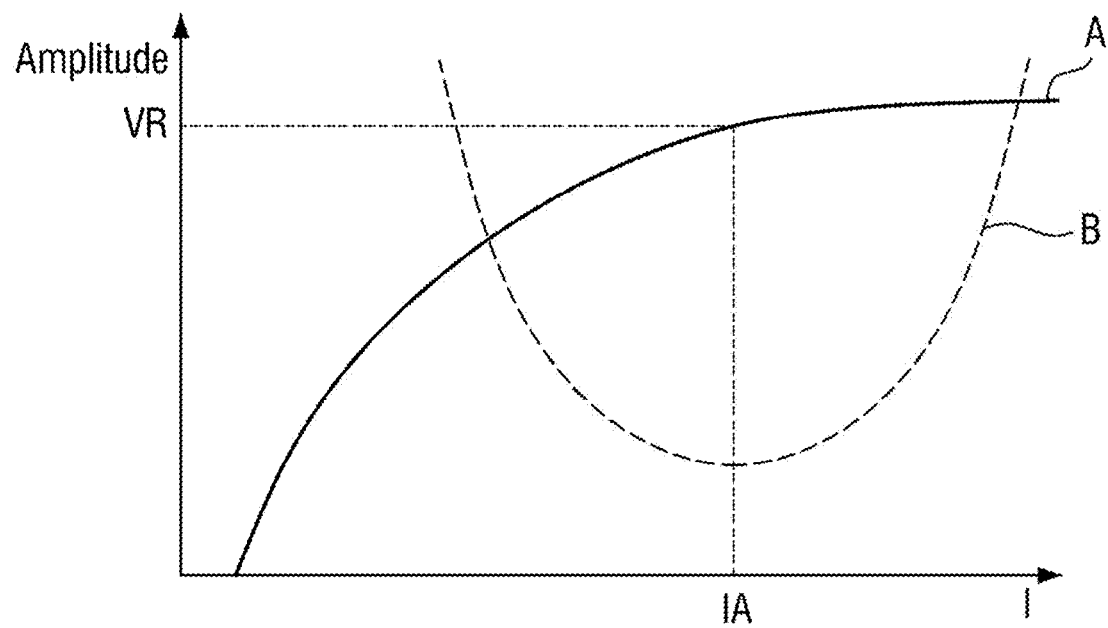
FIG. 4 is a diagram for explaining a reference signal of FIG. 2.
Figure 5:
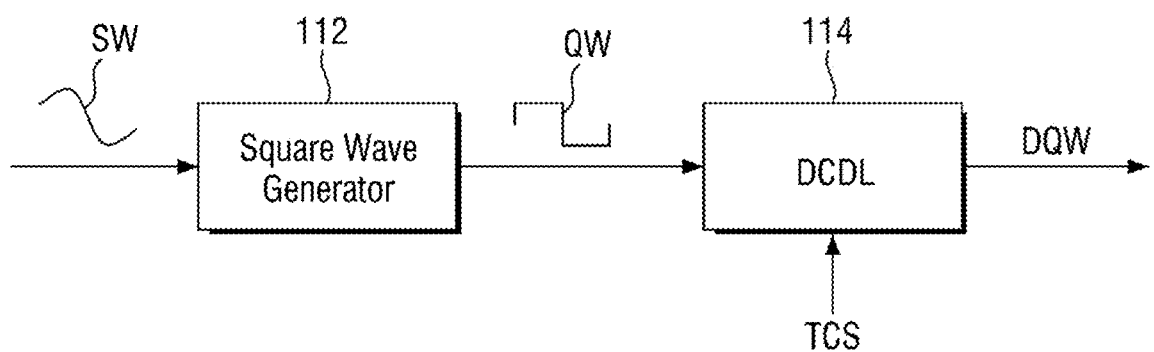
FIG. 5 is an example block diagram of an enable signal generator of FIG. 2.
Figure 6:
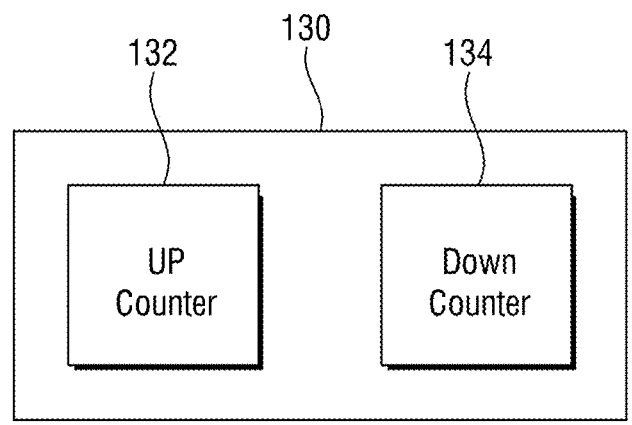
FIG. 6 is an example block diagram of the control signal adjustor of FIG. 2.

FIG. 2 is an example block diagram of the amplitude adjusting device of FIG. 1. FIG. 3 is an example block diagram of the signal generator of FIG. 2. FIG. 4 is a diagram for explaining the reference signal of FIG. 2. FIG. 5 is an example block diagram of an enable signal generator of FIG. 2. FIG. 6 is an example block diagram of the control signal adjustor of FIG. 2.

Referring to FIG. 2, the amplitude adjusting device 100 may include an enable signal generator 110, a comparator 120, and a control signal adjustor 130.

Referring to FIG. 3, the signal generator 200 may include a current source ISRC. The current source ISRC may output a predetermined current I.

In some embodiments, the current source ISRC may receive a current control signal ICS and output a predetermined current I under the control of the current control signal ICS. For example, when the current control signal ICS is a first signal, the current source ISRC may output the current I having the first magnitude, and when the current control signal ICS is a second signal, the current source ISRC may output a current I having a second magnitude different from the first magnitude.

In some embodiments, the current control signal ICS may be a digital signal. Specifically, the current control signal ICS may include a digital signal of m bits, where m represents a natural number. When the current control signal ICS is a digital signal, the current source ISRC may include a digitally controlled current source (DCCS) in which an amount of the current I to be output is adjusted depending on the digital control signal. However, the embodiments are not limited thereto.

The current I which is output from the current source ISRC may be provided to a transistor N1. The transistor N1 may be gated to a signal level of an output node VO.

In some embodiments, the current I which is output from the current source ISRC is provided to a crystal oscillator OX outside the semiconductor chip, and the crystal oscillator OX may generate a sinewave SW accordingly. The sinewave SW generated may be provided to the output node VO of the signal generator 200 through pads P1 and P2.

A variable resistor VR1 may be between the pad P1 and the pad P2. The pad P1 may be connected to the variable capacitor VC2, and the pad P2 may be connected to the variable capacitor VC1. The signal generator 200 may output the sinewave SW through the output node VO, to the outside.

Referring to FIG. 2 again, the comparator 120 may compare the magnitude of the sinewave SW output from the signal generator 200 with the magnitude (VR, e.g., a reference voltage) of the reference signal and output a comparison result (CS).

Here, the magnitude VR of the reference signal may be an optimized amplitude value at which the phase noise of the sinewave SW which is output from the signal generator 200 is reduced or minimized.

Specifically, referring to FIG. 4, as represented by graph A, the magnitude of the current (I of FIG. 3) which is output from the current source (ISRC of FIG. 3) increases, the amplitude of the sinewave may also increase. That is, as shown in graph A, as the magnitude of the current I increases the magnitude of the amplitude also increases.

On the other hand, as represented by graph B, the phase noise has a minimum value in a specific section and an increased value in other sections. Therefore, to optimize the signal, the sinewave should be generated with an optimized amplitude value for the current IA with the minimized phase noise. In this embodiment, the magnitude VR of the reference signal may be set to an amplitude value with the phase noise minimized in this way.

Referring to FIG. 2 again, the comparator 120 compares the magnitude of the sinewave SW output from the signal generator 200 with the magnitude VR of the reference signal and outputs the comparison result (CS), and the comparison timing may be determined depending on the enable signal (ES) which is output from the enable signal generator 110.

In some embodiments, the enable signal generator 110 receive the sinewave SW from the signal generator 200, delay the sinewave SW in accordance with a timing control signal TCS from the control signal adjustor 130, and then the enable signal generator 110 may provide the sinewave to the comparator as an enable signal (ES) which may determine the comparison timing of the comparator 120.

Hereinafter, an example configuration of the enable signal generator 110 will be described with reference to FIG. 5.

Referring to FIG. 5, the enable signal generator 110 may include a square wave generator 112 and a digitally controlled delay line (DCDL) 114.

The square wave generator 112 may convert the provided sinewave SW into a square wave QW. For example, the square wave generator 112 may be an analog-to-digital converter (ADC).

The DCDL 114 may delay the input square wave QW for a predetermined time in accordance with the timing control signal TCS, and then may output a delayed square wave DQW. In some embodiments, the timing control signal TCS may include a digital signal of n bits, where n represents a natural number.

In some embodiments, for example, if the timing control signal TCS is the first signal, the DCDL 114 may delay the input square wave QW by a first timing. If the timing control signal TCS is the second signal, the DCDL 114 may delay the square wave QW by a second timing different from the first timing.

In this way, the delayed square wave DQW may be output from the DCDL 114 to the comparator (120 of FIG. 2) as the enable signal (ES of FIG. 2).

Referring to FIG. 2 again, the control signal adjustor 130 may adjust the current control signal ICS and/or the timing control signal TCS, depending on the comparison result of the comparator 120.

When both the current control signal ICS and the timing control signal TCS include digital signals as illustrated above, the control signal adjustor 130 may include an up counter 132 and a down counter 134 as shown in FIG. 6.

When there is a need to increase the bit values of the current control signal ICS and the timing control signal TCS, the control signal adjustor 130 may increase the bit values of the current control signal ICS and the timing control signal TCS using the up counter 132. When there is a need to decrease the bit values of the current control signal ICS and the timing control signal TCS, the control signal adjustor 130 may decrease the bit values of the current control signal ICS and the timing control signal TCS using the down counter 134. Though not illustrated, the control signal adjustor may include a bidirectional counter and the bit value of the current control signal ICS and the timing control signal TCS may be adjusted therefrom.

In some embodiments, when the magnitude of the sinewave SW is greater than the magnitude VR of the reference signal, the control signal adjustor 130 may adjust the current control signal ICS. When the magnitude of the sinewave SW is smaller than the magnitude VR of the reference signal, the control signal adjustor 130 may adjust the timing control signal TCS.

More specifically, when the magnitude of the sinewave SW is greater than the magnitude VR of the reference signal, the control signal adjustor 130 may decrease (the magnitude (e.g., the bit value) of the current control signal, and when the magnitude of the sinewave SW is smaller than the magnitude VR of the reference signal, the control signal adjustor 130 may increase the magnitude (e.g., the bit value) of the timing control signal TCS. Hereinafter, the method for adjusting the amplitude of signal in the semiconductor device will be described in more detail with reference to FIGS. 7 and 8.

Figure 7:
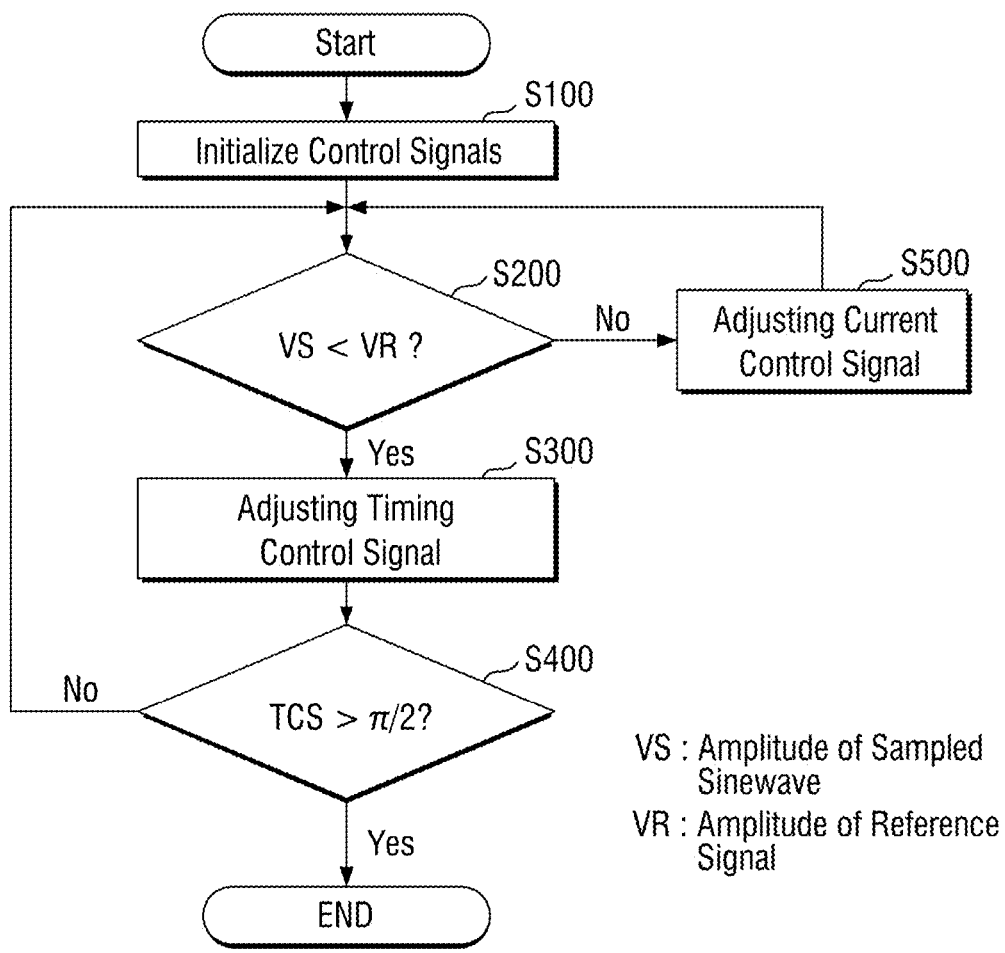
FIG. 7 is a flowchart for explaining a method for adjusting a amplitude of signal in the semiconductor device according to some embodiments.
Figure 8:
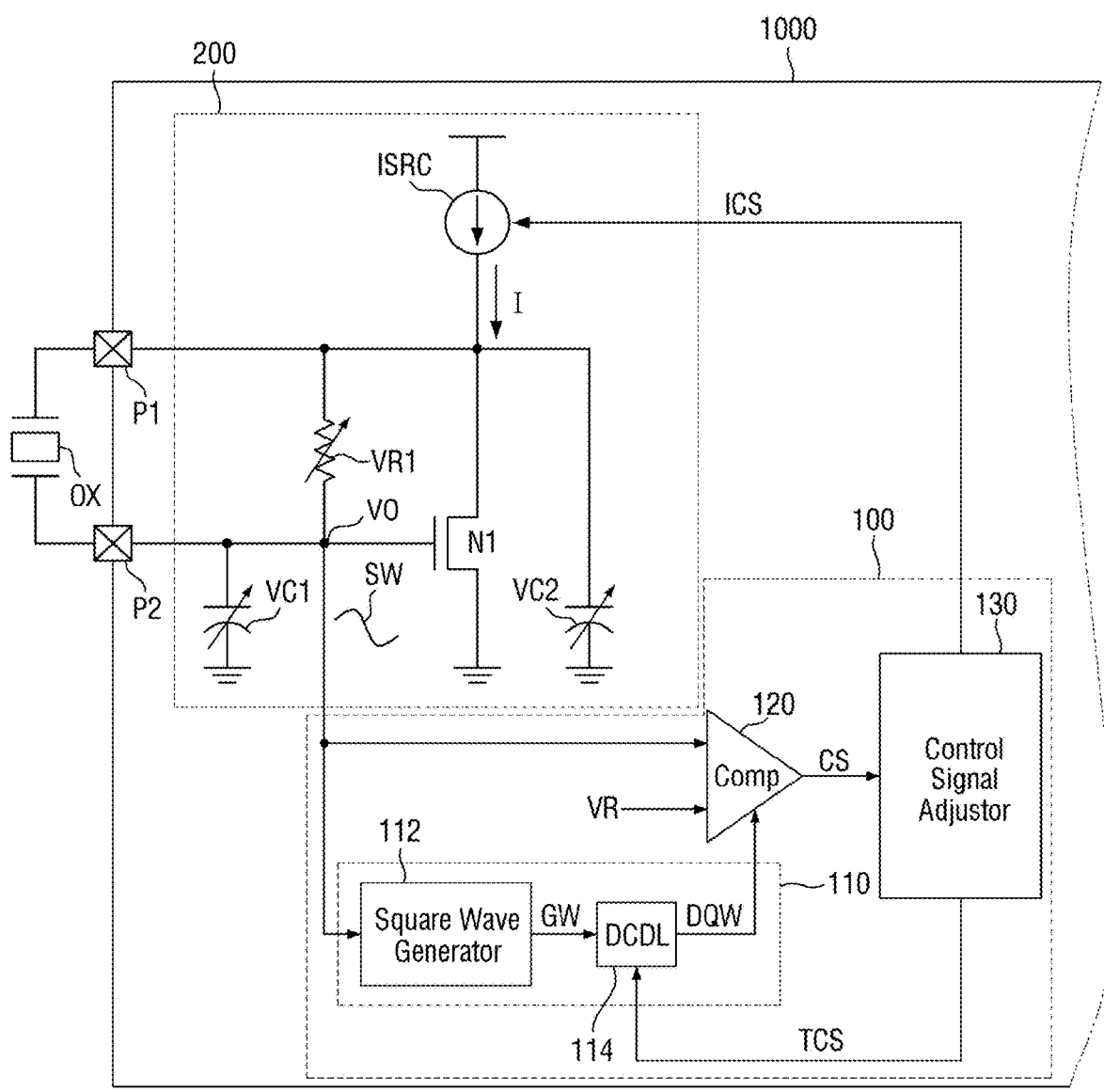
FIG. 8 is a block diagram of the semiconductor device according to some embodiments.

FIG. 7 is a flowchart for explaining a method for adjusting the amplitude of signal in the semiconductor device according to some embodiments. FIG. 8 is a block diagram of the semiconductor device according to some embodiments.

First, referring to FIG. 7, the control signal is initialized (S100).

For example, referring to FIG. 8, the control signal adjustor 130 may initialize the current control signal ICS and the timing control signal TCS. In some embodiments, the control signal adjustor 130 may adjust the magnitude of the current control signal ICS to the maximum and adjust the magnitude of the timing control signal TCS to the minimum. That is, the control signal adjustor 130 may initialize the current control signal ICS so that the current source ISRC outputs current I of the maximum magnitude (or so that the current amount of output current I is maximized) and may initialize the timing control signal TCS so that the DCDL 114 does not delay the square wave QW.

Referring to FIG. 8, remaining constituent elements except the crystal oscillator OX may be in a semiconductor chip 1000, and the crystal oscillator OX may be outside the semiconductor chip 1000. Although the crystal oscillator OX may be connected to the semiconductor chip 1000 through the pads P1 and P2, the embodiments are not limited thereto.

Next, referring to FIG. 7, the magnitude VS of the sinewave and the magnitude VR of the reference signal are compared in response to the enable signal (S200).

As a result of the comparison, when the magnitude VS of the sinewave is smaller than the magnitude VR of the reference signal, the timing control signal is adjusted (S300). Further, it is determined whether the comparison timing corresponding to the timing control signal is before the sinewave reaches a phase of $\pi/2$ (S400). If the comparison point corresponding to the timing control signal is the timing before $\pi/2$ of the sinewave phase, the magnitude VS of the sinewave and the magnitude VR of the reference signal are repeatedly compared (S200). If the comparison timing corresponding to the timing control signal is timing after π/2 of the sinewave phase, the operation is terminated.

On the other hand, if the comparison result shows that the magnitude VS of the sinewave is greater than the magnitude VR of the reference signal, the current control signal is adjusted (S500). Further, the magnitude VS of the sinewave and the magnitude VR of the reference signal are repeatedly compared (S200).

For example, referring to FIG. 8, the comparator 120 compares the magnitude of the sinewave SW with the magnitude VR of the reference signal at the comparison timing corresponding to the enable signal DQW, and outputs the comparison signal CS including the comparison result thereof, and the control signal adjustor 130 may adjust one of the current control signal ICS and the timing control signal TCS in accordance with the comparison result included in the comparison signal CS.

In some embodiments, if the magnitude of the sinewave SW is smaller than the magnitude VR of the reference signal at the comparison timing corresponding to the enable signal DQW, the control signal adjustor 130 adjusts the timing control signal TCS to delay the comparison timing of the comparator 120. If the magnitude of the sinewave SW is greater than the magnitude VR of the reference signal VR, the control signal adjustor 130 may adjust the current control signal ICS to reduce the amplitude of the sinewave SW which is output from the signal generator 200.

Such an operation of the control signal adjustor 130 continues while the comparison timing of the comparator 120 corresponding to the enable signal DQW is before π/2 of the sinewave phase, and if the comparison timing of the comparator 120 corresponding to the enable signal DQW is after the sinewave reaches a phase of π/2, the operation is terminated.

Hereinafter, such an operation will be described more specifically with reference to FIGS. 8 through 10.

Figure 10:
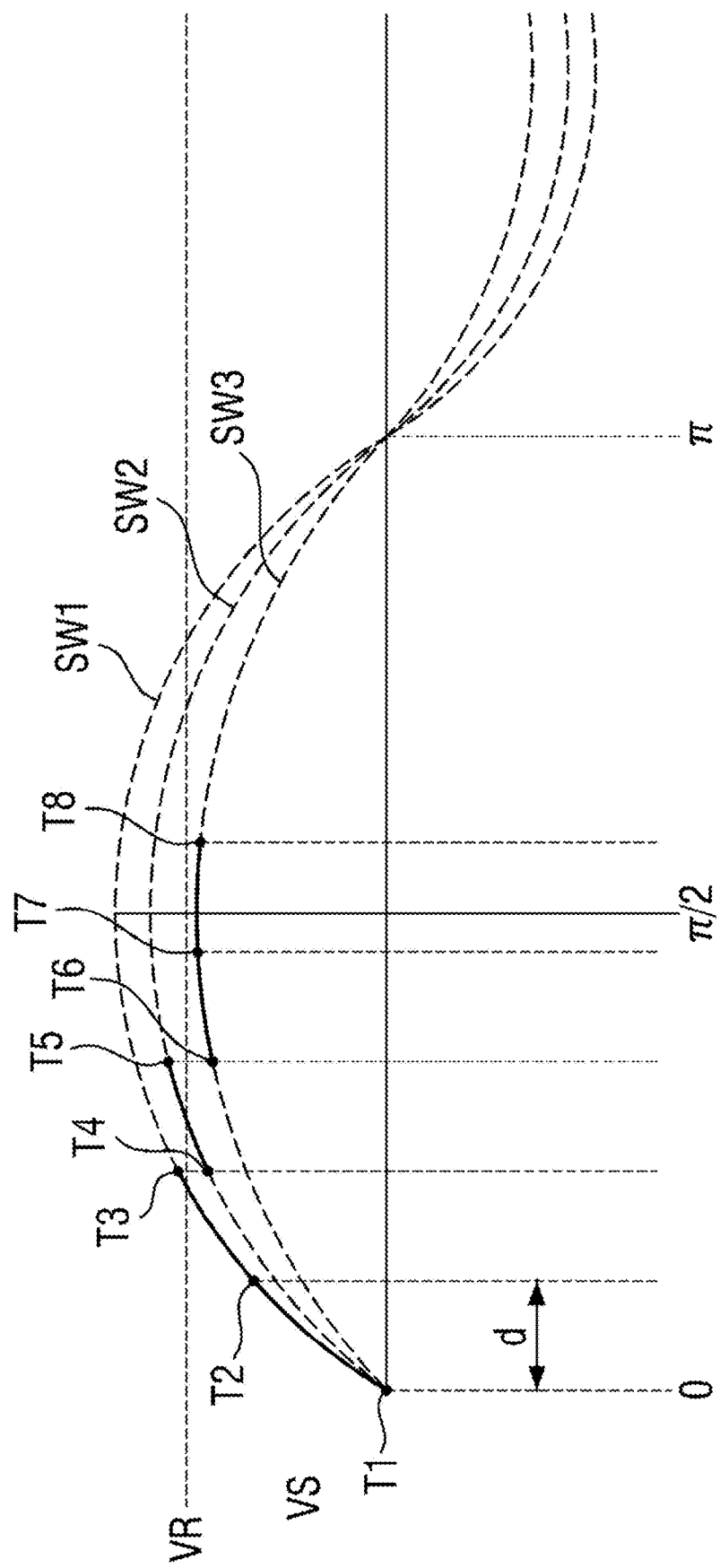

FIGS. 9 and 10 are diagrams for explaining a method for adjusting the amplitude of signal in the semiconductor device according to some embodiments.

Hereinafter, for convenience of explanation, an example in which the current control signal ICS and the timing control signal TCS are each made up of a 3-bit digital signal will be described. However, a person having ordinary skill in the art would recognize that the embodiments are not limited thereto and, for example, may apply to signals with larger bits.

Further, hereinafter, an example in which the amplitude of the sinewave is maximum when the current control signal ICS is 111, and the amplitude of the sinewave is minimum when the current control signal ICS is 000 will be described, and an example in which the delay amount increases as the number of bits of the timing control signal TCS increases will be described. However, such examples are for convenience of explanation, and the embodiments are limited thereto.

First, referring to FIG. 9, in an initialization stage (Init), the current control signal ICS is initialized to 111, and the timing control signal TCS is initialized to 000.

Referring to FIGS. 8 and 10, since the current control signal ICS is initialized to 111, the magnitude of the current I which is output from the current source ISRC is maximized, and the signal generator 200 outputs a sinewave SW1 with the maximum amplitude. On the other hand, since the timing control signal TCS is initialized to 000, no delay occurs in the DCDL 114. Therefore, the comparator 120 compares the magnitude of the sinewave SW1 with the magnitude of the comparison signal VR at the first timing T1.

When the magnitude of the sinewave SW1 and the magnitude of the comparison signal VR are compared at the first timing T1, the magnitude of the sinewave SW1 is smaller than the magnitude of the comparison signal VR. Therefore, the control signal adjustor 130 adjusts the timing control signal TCS to 001.

Since the timing control signal TCS is adjusted to 001, the DCDL 114 provides an enable signal DQW delayed by a predetermined delay (d) to the comparator 120. As a result, the comparator 120 compares the magnitude of the sinewave SW1 with the magnitude of the comparison signal VR at the second timing T2 delayed by the predetermined delay (d) from the first timing T1.

When the magnitude of the sinewave SW1 and the magnitude of the comparison signal VR are compared at the second timing T2, the magnitude of the sinewave SW1 is still smaller than the magnitude of the comparison signal VR. Therefore, the control signal adjustor 130 adjusts the timing control signal TCS to 010.

Since the timing control signal TCS is adjusted to 010, the DCDL 114 provides the enable signal DQW further delayed by a predetermined delay (d) to the comparator 120. As a result, the comparator 120 compares the magnitude of the sinewave SW1 with the magnitude of the comparison signal VR at a third timing T3 delayed by a predetermined delay (d) from the second timing T2.

When the magnitude of the sinewave SW1 and the magnitude of the comparison signal VR are compared at the third timing T3, the magnitude of the sinewave SW1 is now greater than the magnitude of the comparison signal VR. Therefore, the control signal adjustor 130 adjusts the current control signal ICS to 110.

Since the current control signal ICS is adjusted to 110, the current source ISRC reduces the magnitude of the output current I. As a result, the signal generator 200 outputs a sinewave SW2 with reduced amplitude. On the other hand, since the timing control signal TCS did not change from 010, no additional delay occurs in the DCDL 114. Therefore, the comparator 120 compares the magnitude of the sinewave SW2 with the magnitude of the comparison signal VR at a fourth timing T4 having the same timing as that of the third timing T3.

When the magnitude of the sinewave SW2 and the magnitude of the comparison signal VR are compared at the fourth timing T4, the magnitude of the sinewave SW2 is smaller than the magnitude of the comparison signal VR. Therefore, the control signal adjustor 130 adjusts the timing control signal TCS to 011.

Since the timing control signal TCS is adjusted to 011, the DCDL 114 provides a delay enable signal DQW further delayed by a predetermined delay (d) to the comparator 120. As a result, the comparator 120 compares the magnitude of the sinewave SW2 with the magnitude of the comparison signal VR at a fifth timing T5 delayed by the predetermined delay (d) from the fourth timing T4.

When the magnitude of the sinewave SW2 and the magnitude of the comparison signal VR are compared at the fifth timing T5, the magnitude of the sinewave SW2 is now greater than the magnitude of the comparison signal VR. Therefore, the control signal adjustor 130 adjusts the current control signal ICS to 101.

Since the current control signal ICS is adjusted to 101, the current source ISRC reduces the magnitude of the output current I. As a result, the signal generator 200 outputs a sinewave SW3 with reduced amplitude. On the other hand, since the timing control signal TCS did not change from 011, no additional delay occurs in the DCDL 114. Therefore, the comparator 120 compares the magnitude of the sinewave SW3 with the magnitude of the comparison signal VR at a sixth timing T6 having the same timing as that of the fifth timing T5.

When the magnitude of the sinewave SW3 and the magnitude of the comparison signal VR are compared at the sixth timing T6, the magnitude of the sinewave SW3 is smaller than the magnitude of the comparison signal VR. Therefore, the control signal adjustor 130 adjusts the timing control signal TCS to 100.

Since the timing control signal TCS is adjusted to 100, the DCDL 114 provides a delay enable signal DQW further delayed by a predetermined delay (d) to the comparator 120. As a result, the comparator 120 compares the magnitude of the sinewave SW3 with the magnitude of the comparison signal VR at a seventh timing T7 delayed by a predetermined delay (d) from the sixth timing T6.

When the magnitude of the sinewave SW3 and the magnitude of the comparison signal VR are compared at the seventh timing T7, the magnitude of the sinewave SW3 is smaller than the magnitude of the comparison signal VR. Therefore, the control signal adjustor 130 adjusts the timing control signal TCS to 101. As a result, the comparison timing of the comparator 120 now becomes an eighth timing T8.

However, the eighth timing T8 is at the phase of the sinewave after $\pi/2$. In other words, since the amplitude of the sinewave SW3 decreases after that timing, there is no need for further amplitude adjustment through the comparison. Therefore, the amplitude adjustment operation and the comparison timing adjustment operation are no longer executed, after the eighth timing T8. However, through the operations described above, the signal generator 200 may output a sinewave having amplitude with minimized phase noise (e.g., amplitude adjacent to VR of FIG. 4).

Although the magnitude of the predetermined delay (d) is exaggerated for convenience of understanding, the actual predetermined delay (d) may have a very small value. As a result, a lot of comparison operations may actually be executed before the sinewave phase becomes $\pi/2$.

The semiconductor device according to the present embodiment causes the signal generator 200 to output a sinewave with minimized phase noise through such a relatively simple configuration and simple operation. That is, the optimum amplitude adjustment of the crystal oscillator can be performed at a low cost.

Figure 11:
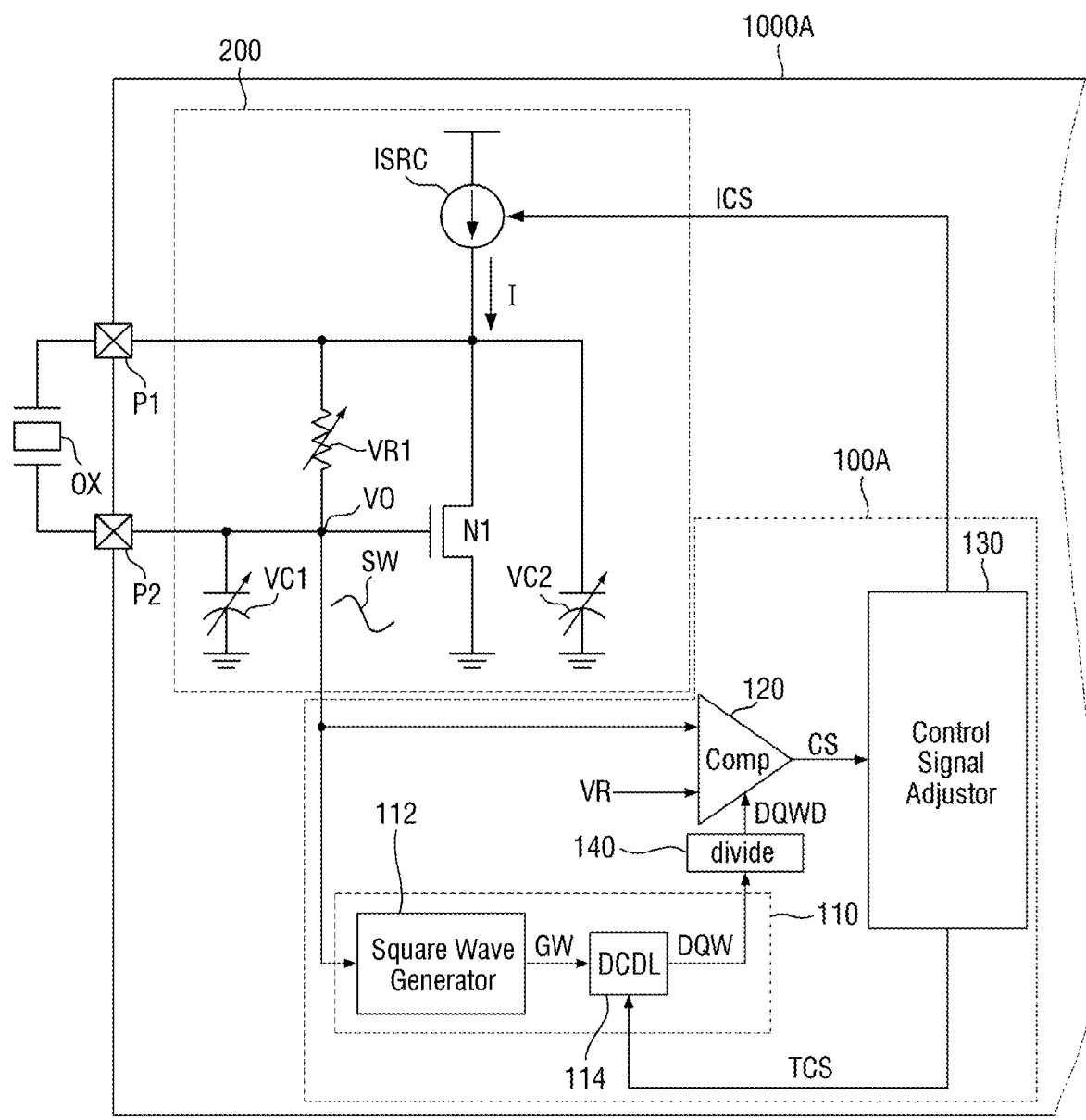
FIG. 11 is a block diagram of the semiconductor device according to some embodiments.

FIG. 11 is a block diagram of the semiconductor device according to some embodiments.

Hereinafter, repeated explanation of that of the above-described embodiment will not be provided, and differences will be mainly explained.

Referring to FIG. 11, the semiconductor chip 1000A may include a divider 140. The divider 140 may divide the signal DQW output from the DCDL 114, and provide the divided signal to the comparator 120 as an enable signal DQWD. As a result, since a predetermined margin may be secured for the comparison timing of the signal of the comparator 120, the reliability of the comparison may be improved.

Figure 12:
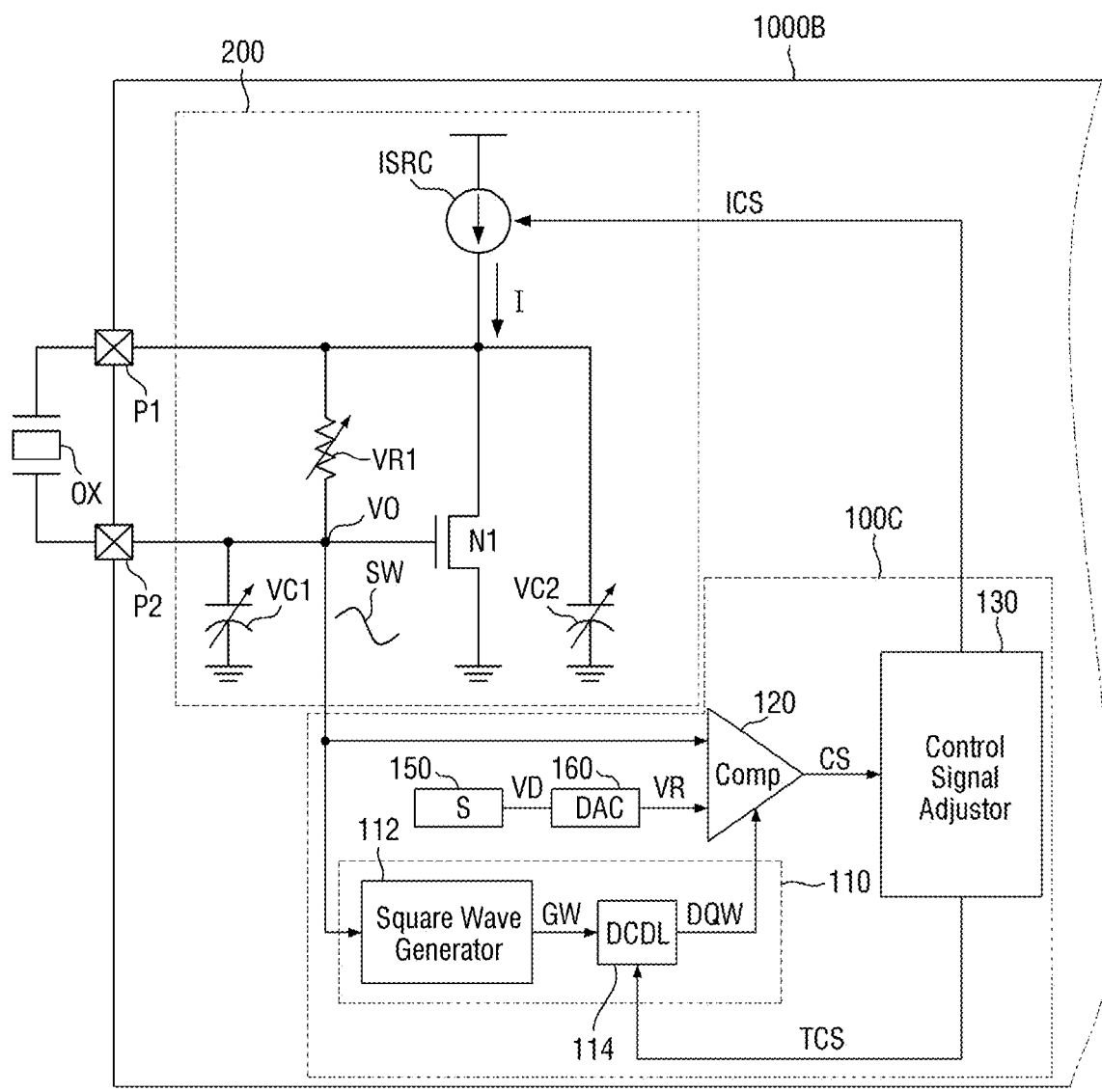
FIG. 12 is a block diagram of the semiconductor device according to some embodiments.

FIG. 12 is a block diagram of the semiconductor device according to some embodiments.

Referring to FIG. 12, the semiconductor chip 1000B may include a storage unit 150 and a digital-analog converter 160.

The storage unit 150 may store digital data VD corresponding to a predetermined condition. Such digital data VD may be data related to the magnitude VR of the reference signal. In some embodiments, the storage unit 150 may store digital data VD related to the magnitude VR of the reference signal in the form of a table. For example, the table may store the magnitude VR of the reference signal as a reference output to an input or index, like the temperature, but the embodiments are not limited thereto. The storage unit 150 may be tangible or non-transitory storage media, such as a random access memory (RAM), read only memory (ROM), a permanent mass storage device (such as a disk drive, solid state (e.g., NAND flash) device, etc.), and/or any other data storage mechanism capable of storing and recording data.

The digital-analog converter 160 may convert the digital data VD stored in the storage unit 150 into an analog signal to generate a reference signal VR. The reference signal VR thus generated may be used for the comparison operation of the comparator 120.

Figure 13:
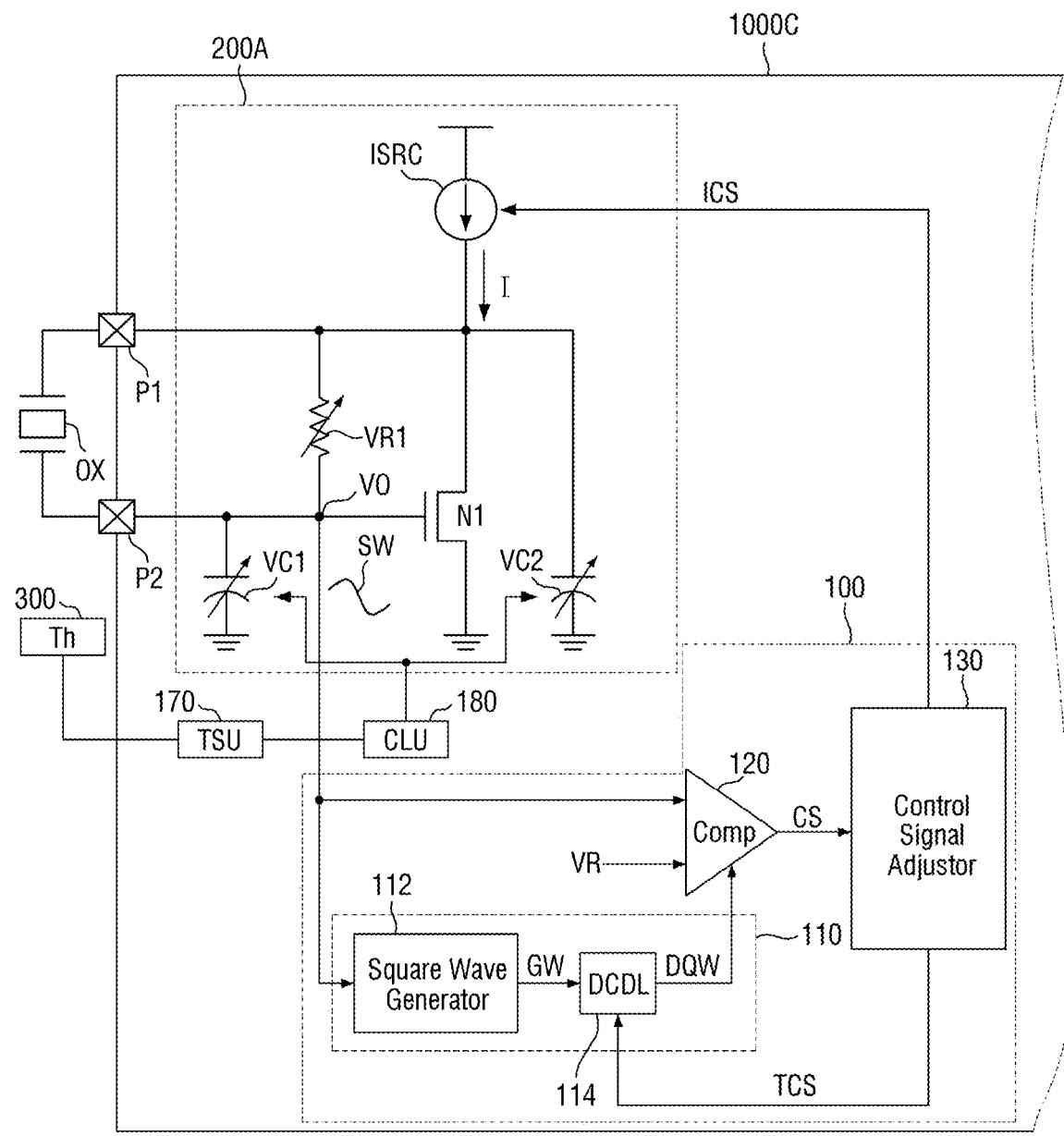
FIG. 13 is a block diagram of the semiconductor device according to some embodiments.

FIG. 13 is a block diagram of the semiconductor device according to some embodiments.

Referring to FIG. 13, the semiconductor device may include a thermistor 300, a temperature sensing unit 170, and a calibration unit 180.

Although the thermistor 300 is depicted outside the semiconductor chip 1000C, and the temperature sensing unit 170 and the calibration unit 180 are depicted as inside the semiconductor chip 1000C, the embodiments are not limited thereto. For example, the thermistor 300 may be a different type of temperature sensor like a thermocouple, a resistive temperature detector, and/or a thermometer.

The temperature sensing unit 170 may detect a temperature change, using the thermistor 300. The calibration unit 180 may adjust the capacitances of the variable capacitors VC1 and VC2 depending on the detected temperature. When the capacitances of the variable capacitors VC1 and VC2 are adjusted depending on the temperature in this way, the frequency of the sinewave SW may be adjusted depending on the detected temperature.

Figure 14:
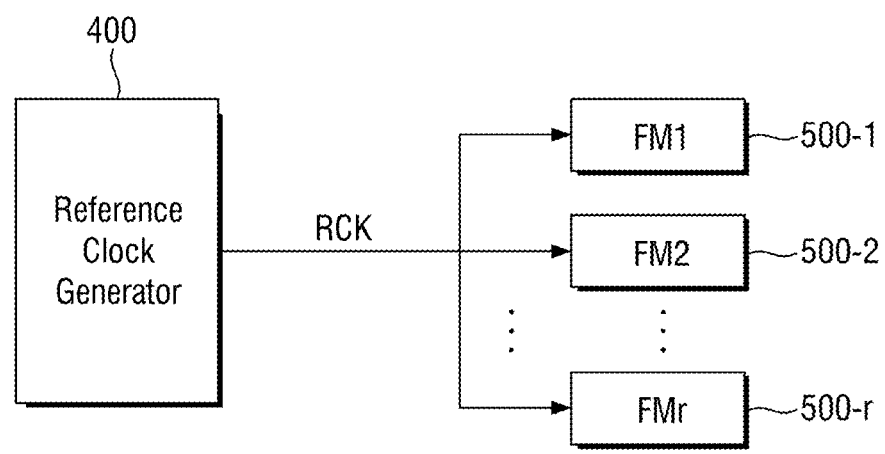
FIG. 14 is a block diagram of the semiconductor device according to some embodiments.

FIG. 14 is a block diagram of the semiconductor device according to some embodiments.

Referring to FIG. 14, the semiconductor device may include a reference clock generator 400 and a plurality of functional modules 500-1 to 500-r.

The reference clock generator 400 may generate a reference clock RCK. For example, the reference clock generator 400 may include a signal generator and an amplitude adjusting device made up of any one of the semiconductor devices according to some embodiments described above, and a clock generator that converts a sinewave into a square wave to generate a reference clock RCK.

The plurality of functional modules 500-1 to 500-r may receive the reference clock RCK from the reference clock generator 400 and execute a predetermined operation, using the reference clock RCK. Although examples of such a functional module may include a phase locked loop (PLL), an input output (10) circuit, and the like, the embodiments are not limited thereto.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
   a signal generator configured to output a sinewave, amplitude of the sinewave being adjusted depending on a current control signal supplied to the signal generator;
   a comparator configured to compare a magnitude of the sinewave provided from the signal generator with a magnitude of a reference signal at a first timing corresponding to a timing control signal and to output a comparison result; and
   a control signal adjustor configured to adjust one of the current control signal and the timing control signal depending on the comparison result of the comparator.

2. The semiconductor device of claim 1, wherein the first timing is before the sinewave reaches a phase of $\pi/2$.

3. The semiconductor device of claim 1, wherein the control signal adjustor is configured to
   adjust the timing control signal if the magnitude of the sinewave is smaller than the magnitude of the reference signal at the first timing, and
   adjust the current control signal if the magnitude of the sinewave is greater than the magnitude of the reference signal at the first timing.

4. The semiconductor device of claim 3, wherein
   the comparator is configured to compare the magnitude of the sinewave with the magnitude of the reference signal at a second timing when the control signal adjustor adjusts the timing control signal,
   the second timing being different from the first timing.

5. The semiconductor device of claim 4, wherein the second timing is later than the first timing.

6. The semiconductor device of claim 5, wherein the first timing and the second timing are before the sinewave reaching a phase of $\pi/2$.

7. The semiconductor device of claim 1, wherein
   the current control signal includes a digital signal of m bits,
   the timing control signal includes a digital signal of n bits, and
   m and n each represent a natural number.

8. The semiconductor device of claim 7, further comprising:
   a digitally controlled delay line (DCDL) configured to receive the timing control signal, and provide an enable signal based on the timing control signal to the comparator,
   wherein the comparator is configured to determine a comparison timing of the comparator based on the enable signal, and
   the signal generator includes a digitally controlled current source (DCCS) configured to adjust a current amount depending on the current control signal.

9. The semiconductor device of claim 8, further comprising:
   a square wave generator configured to convert the sinewave output from the signal generator into a square wave and provide the square wave to the DCDL,
   wherein the DCDL is configured to delay the square wave in accordance with the timing control signal and then provide the delayed square signal to the comparator as the enable signal.

10. The semiconductor device of claim 1, further comprising:
    an enable signal generator configured to receive the sinewave output from the signal generator, delay the sinewave in accordance with the timing control signal, and then provide the delayed sinewave to the comparator as an enable signal
    wherein the comparator is configured to determine the comparison timing based on the enable signal.

11. The semiconductor device of claim 10, wherein the enable signal generator includes:
    a square wave generator configured to convert the sinewave output from the signal generator into a square wave, and
    a digitally controlled delay line (DCDL) configured to delay the square wave in accordance with the timing control signal, the timing control signal including a digital signal of n bits, where n represents a natural number.

12. The semiconductor device of claim 11, further comprising:
    a divider configured to divide the enable signal and provide it to the comparator.

13. The semiconductor device of claim 11, further comprising:
    a storage unit configured to store digital data according to predetermined conditions; and
    a digital-analog converter configured to generate the reference signal by converting the digital data into an analog signal.

14. A semiconductor device comprising:
    a signal generator configured to output a sinewave; and
    an amplitude adjusting device configured to compare a magnitude of the sinewave with a magnitude of a reference signal at first timing before the sinewave reaches a phase of $\pi/2$, and to execute one of a first operation or a second operation on a basis of a comparison result thereof, the first operation including adjusting the magnitude of the sinewave, and the second operation including adjusting a timing of comparing the magnitude of the sinewave with the magnitude of the reference signal to a second timing different from the first timing to compare the magnitude of the sinewave with the magnitude of the reference signal.

15. The semiconductor device of claim 14, wherein the first operation further includes decreasing the magnitude of the sinewave.

16. The semiconductor device of claim 14, wherein
    the amplitude adjusting device is further configured to execute both the first operation and the second operation, and
    the second timing is later than the first timing.

17. The semiconductor device of claim 16, wherein the amplitude adjusting device is configured to adjust the magnitude of the sinewave if the second timing is after the sinewave reaches the phase of $\pi/2$.

18. A semiconductor device comprising:
    a reference clock generator configured to generate a reference clock, the reference clock generator comprising
        a signal generator configured to output a sinewave using a crystal oscillator, the sinewave having a frequency,
        a frequency adjusting device configured to adjust the frequency of the sinewave depending on a temperature change,
        an amplitude adjusting device configured to compare a magnitude of the sinewave with a magnitude of a reference signal at a predetermined comparison timing before a phase of the sinewave reaches $\pi/2$ to adjust the magnitude of the sinewave, and a clock generator configured to convert the sinewave into a square wave to generate the reference clock; and a functional module configured to receive the reference clock from the reference clock generator and to execute a predetermined operation using the reference clock.

19. The semiconductor device of claim 18, wherein the amplitude adjusting device is configured to reduce the magnitude of the sinewave if the magnitude of the sinewave is greater than the magnitude of the reference signal, and adjust a timing of comparing the magnitude of the sinewave with the magnitude of the reference signal if the magnitude of the sinewave is smaller than the magnitude of the reference signal.

20. The semiconductor device of claim 18, wherein the signal generator includes:

a digitally controlled current source (DCCS) configured to adjust an output current in response to a current control signal including a digital signal of m bits, where m is a natural number, and a variable capacitor configured to adjust the frequency of the sinewave, the amplitude adjusting device configured to adjust the magnitude of the sinewave to control the current control signal, and the frequency adjusting device includes a temperature sensing unit configured to detect a temperature, and a calibration unit configured to adjust a capacitance of the variable capacitor depending on the detected temperature.

* * * * *